(12) United States Patent
Gruner et al.

(10) Patent No.: US 9,046,787 B2
(45) Date of Patent: Jun. 2, 2015

(54) MICROLITHOGRAPHIC PROJECTION EXPOSURE APPARATUS

(75) Inventors: Toralf Gruner, Aalen-Hofen (DE); Alexander Epple, Aalen (DE); Markus Degünther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1176 days.

(21) Appl. No.: 13/007,039

(22) Filed: Jan. 14, 2011

(65) Prior Publication Data

US 2011/0109893 A1 May 12, 2011

Related U.S. Application Data

(62) Division of application No. 11/814,928, filed as application No. PCT/EP2005/001435 on Feb. 12, 2005, now abandoned.

(51) Int. Cl.
*G03B 27/42* (2006.01)
*G03F 7/20* (2006.01)

(52) U.S. Cl.
CPC ........ *G03F 7/70108* (2013.01); *G03F 7/70141* (2013.01); *G03F 7/70191* (2013.01)

(58) Field of Classification Search
CPC ... G03F 7/70116; G03F 7/70108; G03F 7/20; G03F 7/70191; G03F 7/70058; G03F 7/701; G03F 7/70158; G03F 7/70225; G03F 7/70275; G03F 7/70075; G03F 7/70133; G03F 7/70258; G03F 7/702; G03F 7/7055
USPC .......................................... 355/53, 63, 67, 77
See application file for complete search history.

(56) References Cited

U.S. PATENT DOCUMENTS

| 5,646,715 | A | 7/1997 | Wangler |
| 5,867,319 | A * | 2/1999 | Sugiyama et al. ............ 359/618 |
| 6,140,653 | A | 10/2000 | Che |
| 6,249,382 | B1 | 6/2001 | Komatsuda |
| 6,466,303 | B1 | 10/2002 | Omura et al. |

(Continued)

FOREIGN PATENT DOCUMENTS

| EP | 0 658 810 B1 | 6/1995 |
| EP | 0 952 491 | 10/1999 |

(Continued)

OTHER PUBLICATIONS

English translation of Japanese Office Action for corresponding JP Appl No. 2008-074537, dated Nov. 30, 2010.

(Continued)

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

A projection exposure apparatus has a projection lens with an object plane, an image plane, an optical axis and a non-telecentric entrance pupil. The apparatus further comprises an illumination system having an intermediate field plane and a field stop. The field stop is positioned in or in close proximity to the intermediate field plane and defines an illuminated field in the object plane that does not contain the optical axis of the projection lens. The illumination system is configured such that, in the object plane, a mean of the angles formed between all principal rays emanating from the intermediate field plane on the one hand and the optical axis of the projection lens on the other hand differs from 0°.

23 Claims, 6 Drawing Sheets

(56) References Cited

U.S. PATENT DOCUMENTS

| | | |
|---|---|---|
| 2001/0012101 A1 | 8/2001 | Mulkens |
| 2001/0043408 A1 | 11/2001 | Wangler et al. |
| 2003/0227603 A1 | 12/2003 | Dierichs |
| 2004/0137343 A1* | 7/2004 | Eurlings et al. .................. 430/30 |
| 2004/0257669 A1* | 12/2004 | Koehler ......................... 359/676 |
| 2005/0140958 A1* | 6/2005 | Fiolka et al. .................... 355/71 |
| 2006/0139608 A1* | 6/2006 | Wiener et al. ................... 355/69 |

FOREIGN PATENT DOCUMENTS

| | | |
|---|---|---|
| EP | 0 964 282 | 12/1999 |
| EP | 1 118 910 | 7/2001 |
| EP | 1 139 173 | 10/2001 |
| JP | H09-026554 | 1/1997 |
| JP | 2000-058442 | 2/2000 |
| JP | 2001-237183 | 8/2001 |
| JP | 2002-222757 | 8/2002 |
| JP | 2004-22708 | 1/2004 |
| JP | 2004-303810 | 10/2004 |
| JP | 2004-342711 | 12/2004 |

OTHER PUBLICATIONS

English translation of the Japanese Office Action for corresponding JP Appl. No. 2008-074537, dated Nov. 18, 2010.

* cited by examiner

MICROLITHOGRAPHIC PROJECTION EXPOSURE APPARATUS

CROSS-REFERENCE TO RELATED APPLICATIONS

This application is a divisional, and claims priority under 335 U.S.C. §120 to, U.S. application Ser. No. 11/814,928, filed Jul. 27, 2007, which is a National Phase application under 35 U.S.C. §371 filed from International Patent Application Ser. No. PCT/EP2005/01435, filed on Feb. 12, 2005. The entire contents of U.S. patent application Ser. No. 11/814,928 are incorporated herein by reference.

BACKGROUND OF THE INVENTION

1. Field of the Invention

The present invention relates generally to microlithographic projection exposure apparatuses comprising an illumination system and a projection lens. More particularly, the invention relates to such apparatuses in which the optical axis of the projection lens does not intersect an illuminated field on a mask that is to be projected.

2. Description of Related Art

Microlithography (also called photolithography) is a technology for the fabrication of integrated circuits, liquid crystal displays and other microstructured devices. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus, such as a step-and-scan tool. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed.

A projection exposure apparatus typically includes an illumination system, a projection lens and a wafer alignment stage for aligning the wafer coated with the photoresist. The illumination system illuminates a region of the mask with an illumination field that may have the shape of an elongated rectangular slit, for example.

Projection lenses of the catadioptric type do not only contain refractive lens elements but also curved imaging mirrors. The use of curved mirrors is particularly useful in view of the correction of chromatic aberrations and field curvature. In catadioptric lens designs that use polarization selective beam splitter cubes, it is possible to image objects that are centered with respect to the optical axis of the projection lens. However, the use of such beam splitter cubes or similar means has drawbacks, particularly in cases in which the polarization state of the projection light shall not be disturbed by the projection lens.

This has led to the development of catadioptric projection lenses with off-axis fields. With these lenses, the illuminated field on the mask does not contain the optical axis of the projection lens. Such off-axis fields can be projected through the projection lens without the need for beam splitters because the concave mirrors can be positioned such that the projection light bundle impinges obliquely thereon. Thus light cannot be reflected back towards the mask.

In order to achieve good imaging properties, the distribution of the principal rays produced by the illumination system should match as closely as possible the distribution of the principal rays of the projection lens.

Some projection lenses have a homocentric entrance pupil. This may require less refractive power on the entrance side of the projection lens and thus simplify the correction of the field curvature. The illumination system is then designed such that its exit pupil coincides with the entrance pupil of the projection lens. This usually requires only minor adaptations of the focal length of the last group of lens elements contained in the illumination system.

The situation becomes more complicated, however, if the projection lens has not only a homocentric entrance pupil but also an off-axis illuminated field. In principle it would be possible to further increase the geometrical optical flux of the illumination system so that the off-axis field can be properly illuminated. However, this considerably increases the design and manufacturing costs of the illumination system.

U.S. Pat. No. 6,249,382 B1 addresses this problem by proposing to introduce a shift of the optical axis within the illumination system. In a first part of the illumination system between a light source and a field stop, the projection light bundle is centered around the optical axis. In a second section between the field stop and the mask plane, the optical axis is laterally shifted. As a result, the projection light bundle does not contain the optical axis in an intermediate field plane in which a field stop is located. Since both the exit pupil of the illumination system and the entrance pupil of the projection lens are telecentric, this arrangement still ensures a good match between the principal ray distributions.

However, a significant mismatch of the principal ray distributions occurs if the projection lens is not telecentric, but more or less homocentric on its entrance side.

SUMMARY OF THE INVENTION

It is therefore an object of the present invention to improve the principal ray distribution provided by the illumination system in the case of projection lenses having a non-telecentric entrance pupil and an off-axis illuminated field.

According to the present invention, this object is achieved with a projection exposure apparatus comprising:
a) a projection lens having
   an object plane,
   an image plane,
   an optical axis and
   a non-telecentric entrance pupil,
b) an illumination system having
   an intermediate field plane,
   a field stop that
      is positioned in or in close proximity to the intermediate field plane and
      defines, in the object plane of the projection lens, an illuminated field that does not contain the optical axis of the projection lens,
   wherein the illumination system is configured such that, in the object plane, a mean of the angles formed between all principal rays emanating from the intermediate field plane on the one hand and the optical axis of the projection lens on the other hand differs from 0°.

It has been discovered that the introduction of a certain mean angle differing from 0° between the principal rays and the optical axis of the projection lens significantly improves the match between the principal ray distribution provided by the illumination system and the principal ray distribution required by the projection lens. This is due to the fact that the principle rays of a non-telecentric projection lens traverse obliquely an off-axis field that is to be imaged.

One way to achieve this result is to use an illumination system that has, at least in a section immediately adjacent to the object plane of the projection lens, an optical axis that is tilted with respect to the optical axis of the projection lens. In this case the principal ray distribution of the projection lens, which is rotationally symmetric to its optical axis, is approximated by a principal ray distribution which is rotationally symmetric with respect to the tilted optical axis of the illumination system.

Another approach to achieve a mean angle between the principal rays and the optical axis of a projection lens is to use an optical element within the illumination system that has an axis of symmetry that is not coaxial with an optical axis of the illumination system. Such a laterally displaced or tilted element usually tilts the projection light bundle even if the optical axes of the projection lens and the illumination system are coaxial. Laterally displacing an optical element means in this context that the axis of symmetry of the optical element is still aligned parallel to the optical axis of the illumination system, but spaced apart from the latter, for example by at least 5 mm. Alternatively, asymmetrical optical elements such as wedges may be used for tilting the projection light bundle.

In a further advantageous embodiment the illumination system comprises a field stop lens that images the field stop onto the object plane of the projection lens. In order to achieve a sharp image of the field stop on the object plane of the projection lens, a plane defined by the position of the field stop, a principal plane of the field stop lens and the object plane of the projection lens should at least approximately intersect along a straight line. This is a requirement resulting from what is usually referred to as the Scheimpflug condition.

In a still further advantageous embodiment, the field stop lens has an intermediate image plane. Such an intermediate image plane is advantageous because there is often a need for using additional optical elements that have, particularly for correction purposes, to be positioned in or in close proximity to a field plane. In conventional illumination systems, there is usually only one field plane that is mainly occupied by the field stop. Since these field stops have become quite bulky in the past, it is difficult to locate additional optical elements in or close to this field plane. By providing an additional intermediate field plane within the field stop lens, additional space is provided for optical elements that have to be located in or in close proximity to a field plane. In this context, the term "close proximity" is to be understood to include a range from 0 mm to about 100 mm, and more preferably a range from 0 mm to about 30 mm.

A correction element located in the intermediate image plane may be advantageously used for further adapting the principle ray distribution of the illumination system to the principle ray distribution required by the projection lens. However, it should be understood that an intermediate image plane within the field stop lens is also useful if the projection lens does not have a homocentric entrance pupil and an off-axis field.

The correction element to be located in the intermediate image plane may be taken from a large variety of optical elements, for example: a gray filter, a refractive or diffractive optical element, a stop, a polarization manipulating element such as a polarizer or a rotator, a lens containing at least one lens element, dynamic or static semi-transparent or opaque fingers such as disclosed in EP 0 952 491 A2, or a layered structure having a transmission that is dependent on the angle of incidence of an impinging light ray. Such a layered structure may generally, i.e. not only in the context of the present invention, be useful as a correction element in or in close proximity of a field plane.

In a further advantageous embodiment the correction element is received in a holder that allows to adjust the position of the correction element. For example, a refractive or diffractive optical element may be tilted with respect to the optical axis. Generally, the holder may allow to displace the correction element in a direction along and/or in a direction inclined to an optical axis of the illumination system. The holder may be configured to deform the correction element, which may be particularly useful if the correction optical element is a lens.

If the illumination system shall be adapted to different operational modes, for example different angular intensity or polarization distributions, it may be necessary to replace optical correction elements positioned in the intermediate image plane. To this end, the holder may be configured as an exchange holder that allows to receive different correction elements.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
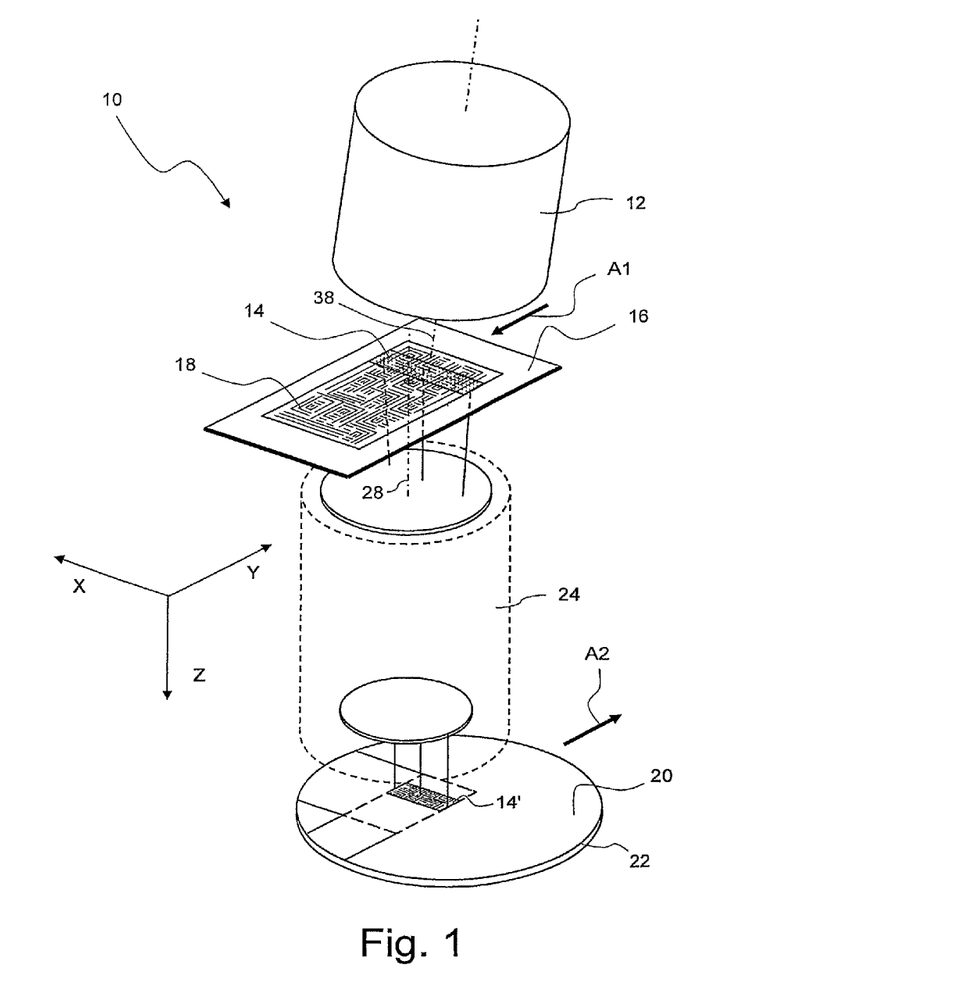
FIG. 1 is a perspective and simplified view of a projection exposure apparatus comprising an illumination system and a projection lens.

FIG. 1 shows a perspective and highly simplified view of an exemplary projection exposure apparatus according to the invention. The projection exposure apparatus, which is denoted in its entirety by 10, comprises an illumination system 12 that produces a projection light bundle. The projection light bundle illuminates, in the embodiment shown, an elongated rectangular light field 14 on a mask 16 containing minute structures 18. Alternatively, the geometry of the illuminated field 14 may be defined by one or more curved lines.

A projection lens 24 images the structures 18 within the illuminated field 14 onto a light sensitive layer 20, for example a photoresist, which is deposited on a substrate 22. The substrate, which is realized in this embodiment as a silicon wafer, is arranged on a stage in an image plane of the projection lens 24. The mask 16 is positioned on a further stage in an object plane of the projection lens 24. Since the latter has a magnification of less than 1, a minified image 14' of the structures 18 within the illuminated field 14 is projected onto the light sensitive layer 20. The optical axis 38 of the illumination system 12 is tilted along the Y-direction with the respect to the optical axis 28 of the projection lens 24, as will be explained in more detail below with reference to FIG. 3.

During the projection, the mask 16 and the substrate 22 are moved along a scan direction along the Y-direction. The ratio between the velocities of the mask 16 and the substrate 22 is equal to the magnification of the projection lens 24. If the projection lens 24 inverts the image, the mask 16 and the substrate 22 move in opposite directions, as this is indicated in FIG. 1 by arrows A1 and A2. Thus the illuminated field 14 scans over the mask 16 so that structured areas on the mask 16 can be continuously projected that are larger than the illuminated field 14. Such a type of projection exposure apparatus is often referred to as "scanner". However, the present invention may also be applied to projection exposure apparatuses of the "stepper" type in which there is no movement of the mask and the wafer during the projection.

Figure 2:
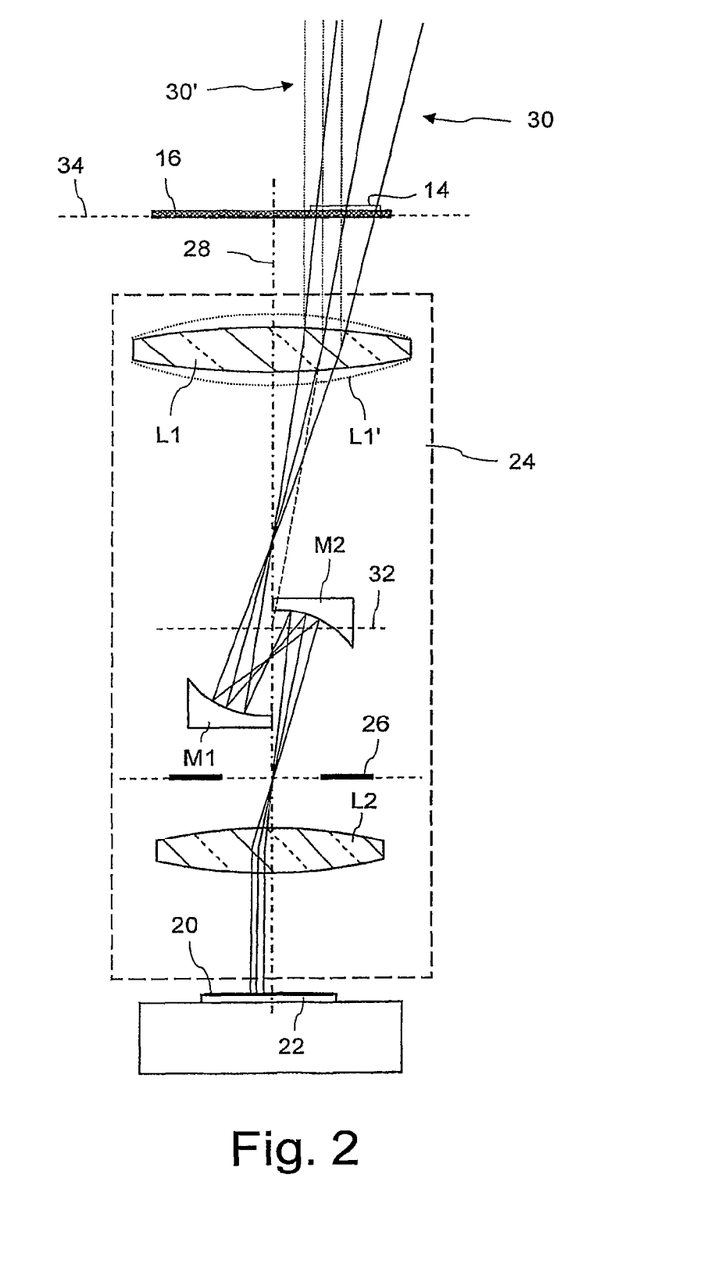
FIG. 2 is a simplified meridional section through the projection lens shown in FIG. 1.

FIG. 2 shows a simplified meridional section through the projection lens 24 used in the projection exposure apparatus 10. In this simplified representation, the projection lens 24 comprises only two lens elements L1, L2, two concave mirrors N1, M2 and an aperture stop 26. These optical elements are aligned along a common optical axis 28. The term "optical axis" refers to an imaginary straight line running through the centers of curvature of the optical elements. Due to the use of the concave mirrors M1, M2, the illuminated field 14 on the mask 16 has to be positioned slightly off the optical axis 28, i.e. the optical axis 28 does not intersect the illuminated field 14.

Reference numeral 30 denotes a bundle of principal rays passing the illuminated field 14 on the mask 16. Principal rays are those rays that pass through the center of the aperture stop 26, thereby intersecting the optical axis 28. The principal rays 30 also pass, at least for the paraxial region, an entrance pupil 32 of the projection lens 24. The entrance pupil 32 is the image of the aperture stop 26 on the object side of the projection lens 24.

The mask 16 is positioned in a mask plane 34 that coincides with the object plane of the projection lens 24. The principal rays 30 intersect the mask plane 34 obliquely at different angles. In particular, the tangent of the angles formed between the principal rays 30 and the optical axis OA at least approximately varies linearly with increasing distance from the optical axis 28. This condition is what characterizes a homocentric entrance pupil 32.

Commonly, projection lenses in projection exposure apparatuses have a telecentric entrance pupil. This means that the principal rays perpendicularly intersect the mask plane 34. The main advantage of having a telecentric entrance pupil is that no substantial magnification error occurs even if the mask is not perfectly plane or not exactly positioned in the mask plane 34. Projection lenses having telecentric entrance pupils, however, require more refractive power on their entrance side. This is schematically indicated in FIG. 2 by a bundle of telecentric principal rays 30' and a lens element L1', both drawn in dotted lines. Having less refractive power in the vicinity of the mask 16, as is the case with projection lenses having a homocentric entrance pupil, considerably simplifies the correction of field curvature and thus reduces the costs for designing and manufacturing the projection lens.

The projection lens 24 is well corrected in view of pupil aberrations. This means that the axial position of the entrance pupil 32 is almost the same for all principal rays 30 intersecting the illuminated field 14. In particular, the aperture stop 26 should be imaged with small spherical aberrations for all principal rays 30.

Figure 3:
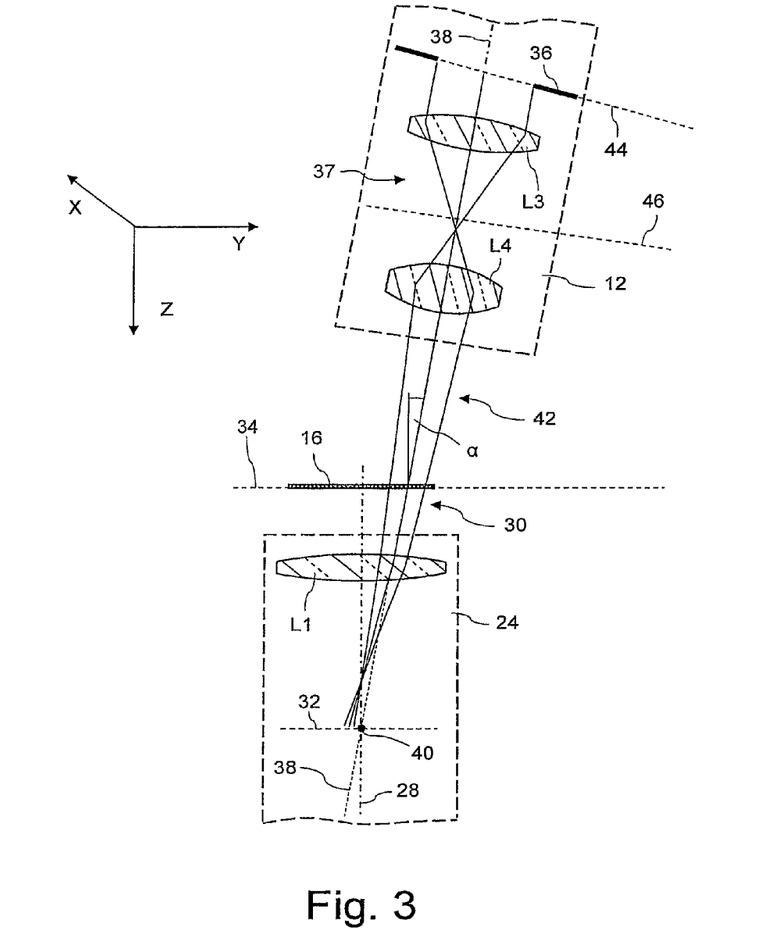
FIG. 3 shows the mask and the adjacent parts of the projection lens and the illumination system of a projection exposure apparatus according to a first embodiment of the invention in which the projection lens and the illumination system have non-parallel optical axes.

FIG. 3 shows the upper part of FIG. 2, together with a part of the illumination system 12 in the vicinity of the mask plane 34. The illumination system 12 comprises a field stop 36 and a field stop lens 37 that images the field stop 36 on the mask plane 34. The field stop 36 thus defines the geometry of the illuminated field 14 on the mask 16. To this end, the field stop 36 may comprise two sets of opposing blades that are adjustable so that the geometry of the illuminated field 14 can be modified. In an exposure apparatus of the scanner type, the blades limiting the short lateral sides of the illuminated field 14 should be exactly in the object plane of the field stop lens 37 in order to achieve sharp edges of the illuminated field 14 on the mask 16. The blades that define the long edges of the illuminated field 14 can, due to the scan process, be slightly out of focus and may comprise a plurality of small finger-like blades that can individually be moved for controlling the intensity uniformity of the illuminated field 14. A suitable construction for the field stop 36 is disclosed in EP 0 952 491 A2, whose full disclosure is incorporated herein.

The field stop lens 37 is represented in FIG. 3 by two exemplary lens elements L3, L4 that are centered along the common optical axis 38. As has been mentioned before, the optical axis 38 of the illumination system 12 is tilted with respect to the optical axis 28 of the projection lens 24 by a tilt angle α in such way that the optical axis 38 intersects, at least approximately, the center of the illuminated field 14 of the mask 16. The tilt axis 40 is parallel to the X-direction, intersects the optical axis 28 of the projection lens 24 and is positioned in the vicinity of the entrance pupil 32. The tilt angle α is typically in the range between 1° and 20° and, in the majority of typical projection lens designs, in the range between 3° and 8°. The result of the introduction of a tilt angel a between the optical axes 28, 38 is that the mean of the angles formed in the mask plane 34 between the principal rays 42 and the optical axis 28 differs from 0° by the tilt angel α.

The combination of tilting the optical axes 28, 38 of the projection lens 24 and the illumination system 12, respectively, together with the homocentric entrance pupil 32 and the off-axis field 14, results in a situation in which the distribution of the principal rays 42 emerging from the illumination system 12 match, in a good approximation, the distribution of the principal rays 30 of the projection lens 24. Remaining differences between the distributions of the principal rays are mainly due to the fact that the distribution of the principal rays 30 of the projection lens 24 is rotationally symmetric with respect to the optical axis 28, whereas the distribution of the principal rays 42 of the illumination system 12 has a different axis of symmetry, namely the optical axis 38. However, since the projection light bundle in the illumination system 12 is still centered with respect to the optical axis 38, the geometrical optical flux and thus the complexity of the illumination system 12 can be kept small.

In order to image the field stop 36 properly on the mask 16, the plane in which the field stop 36 is arranged and which is denoted in FIG. 3 by 44, has to be inclined. Ideally, this plane 44, a principal plane 46 of the field stop lens 37 and the mask plane 34 should intersect along a common straight line. If this condition, which is also referred to as Scheimpflug condition, prevails, the field stop 36 will be sharply imaged onto the mask plane 34 although the mask plane 34 is not positioned perpendicularly to the optical axis 38 of the illumination system 12.

Figure 4:
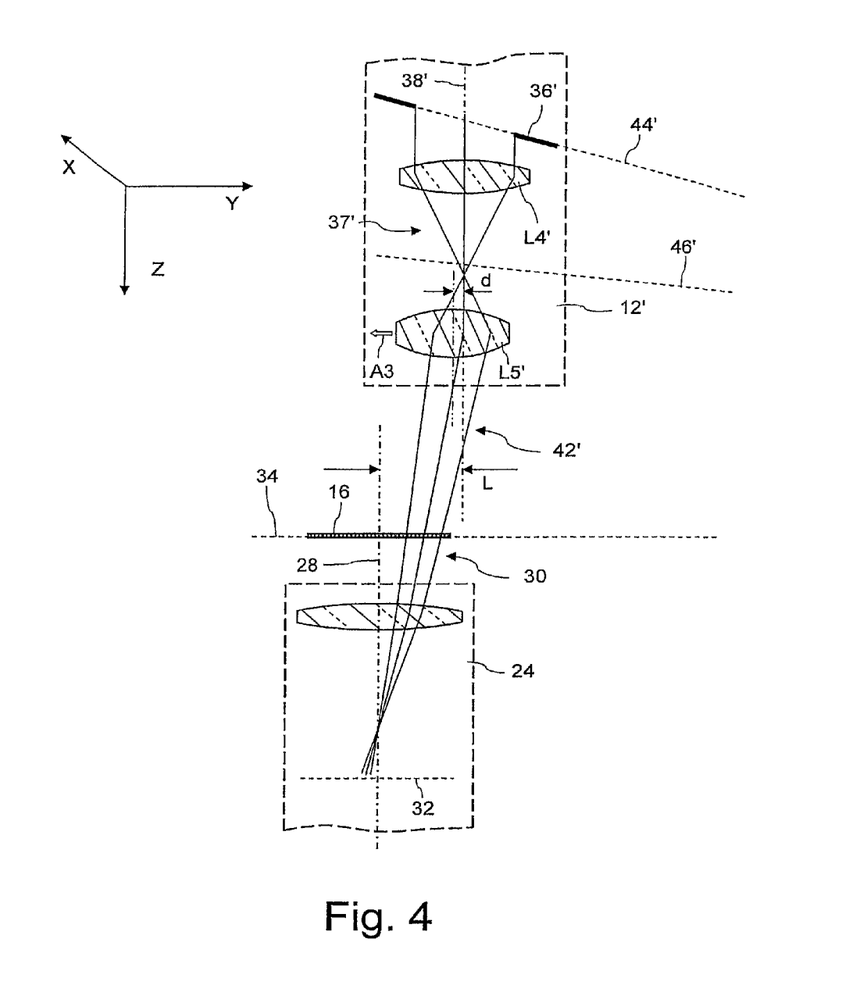
FIG. 4 shows the mask and the adjacent parts of the projection lens and the illumination system of a projection exposure apparatus according to a second embodiment of the invention in which a lens element in the illumination system is laterally displaced.

FIG. 4 shows an alternative embodiment with a different illumination system denoted by 12'. In this embodiment, the optical axis 38' of the illumination system 12' is not tilted with respect to the optical axis 28 of the projection lens 24. Instead, both optical axes 28, 38' are spaced apart along the Y-direction by a lateral distance L. In order to achieve a similar distribution of principal rays 42' that approximately matches the distribution of the principal rays 30 of the projection lens 24, the lens element L4' is, in the embodiment shown, laterally, i.e. in a direction perpendicular to the optical axis 38, displaced by a distance d. The lateral displacement is indicated in FIG. 4 by an arrow A3.

As a result of this displacement, the principal rays 42' emerge from the illumination system 12' obliquely in such a way that once again the mean of the angles formed in the mask plane 34 between the principal rays 42' and the optical axis 28 differs from 0°.

Instead of laterally displacing the lens element L4', this lens element L4' or another lens element of the field stop lens 37' may alternatively or additionally be displaced, tilted, deformed or provided with aspherical surfaces so that a similar effect is achieved. These measures may also been taken if, in the embodiment shown in FIG. 3, the distribution of the principal rays 42 shall be improved in order to reduce a residual mismatch of the principal ray distributions of the illumination system 12 on the one hand and the projection lens 24 on the other hand.

Figure 5:
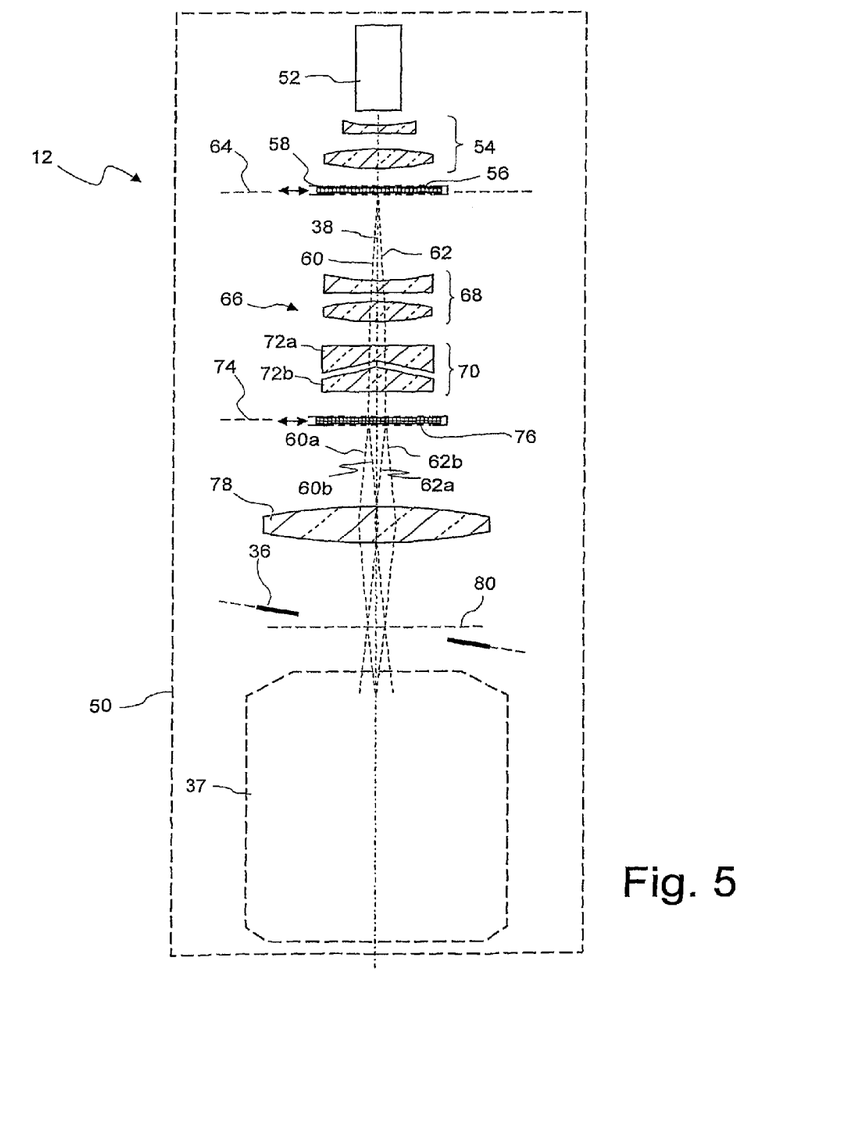
FIG. 5 is a more detailed meridional section through the illumination system of FIG. 3.

FIG. 5 shows a more detailed illustration of the illumination system 12 of FIG. 3 in a meridional section. For the sake of clarity, the illustration shown in FIG. 5 is considerably simplified and not to scale. This particularly implies that different optical units are represented by very few optical elements only. In reality, these units may comprise significantly more lenses and other optical elements.

The illumination system 12 comprises a housing 50 and a light source that is, in the embodiment shown, realized as an excimer laser 52. The excimer laser 52 emits projection light that has a wavelength in the deep ultraviolet (DUV) spectral range, for example 193 nm. Other wavelengths, for example 248 nm or 157 nm, are also considered.

The projection light emitted by the excimer laser 52 enters a beam expansion unit 54 in which the light bundle is expanded. After passing through the beam expansion unit 54, the projection light impinges on a first optical raster element 56. The first optical raster element 56 is received in a holder 58 so that it can easily be replaced by other optical raster elements having different properties. The first optical raster element 56 comprises, in the embodiment shown, one or more diffraction gratings that deflect each incident ray such that a divergence is introduced. This means that at each location on the optical raster element 56, light is diffracted within a certain range of angles. This range may extend, for example, from −3° to +3°. In FIG. 5 this is schematically represented for an axial ray that is split into two diverging rays 60, 62. The first optical raster element 56 thus modifies the angular distribution of the projection light and influences the local intensity distribution in a subsequent pupil plane.

The first optical raster element 56 is positioned in an object plane 64 of a first lens 66 that is indicated by a zoom lens group 68 and a pair 70 of axicon elements 72a, 72b having opposing conical faces. If both axicon elements 72a, 72b are in contact, the axicon group has the effect of a plate having parallel plane surfaces. If both elements 72a, 72b are moved apart, the spacing between the axicon elements 72a, 72b results in a shift of light energy radially outward. Since the axicon group is known as such, it will not be explained here in further detail.

Reference numeral 74 denotes an exit pupil plane of the first lens 66. A second optical raster element 76 is positioned in or in close proximity to the exit pupil plane 74 of the first lens 66. The second optical raster element 76 introduces a divergence for each point and influences the geometry of the illuminated field 14 on the mask M. If the illuminated field 14 has the shape of a slit as is shown in FIG. 1, the numerical aperture of the second optical raster element 76 may be in the range from 0.28 to 0.35 in the X-direction and in the range from 0.03 to 0.09 in the Y-direction.

The second optical raster element 76 may, similar to the first optical raster element 56, be realized as a diffractive optical element, a micro-lens array or a combination of both. The divergence introduced by the second optical raster component 76 is schematically represented in FIG. 5 by divergent rays 60a, 60b and 62a, 62b for the impinging rays 60 and 62.

The diverging rays 60a, 60b and 62a, 62b enter a second lens 78 that is represented in FIG. 5 by a single condenser lens element. The second lens 78 is arranged within the illumination system 12 such that its entrance pupil plane coincides with the exit pupil plane 74 of the first lens 66. The image plane 80 of the second lens 78 is a field plane, close to which the field stop 36 is positioned. The field stop lens 37 then images the field stop 36 onto the mask plane 34.

Figure 6:
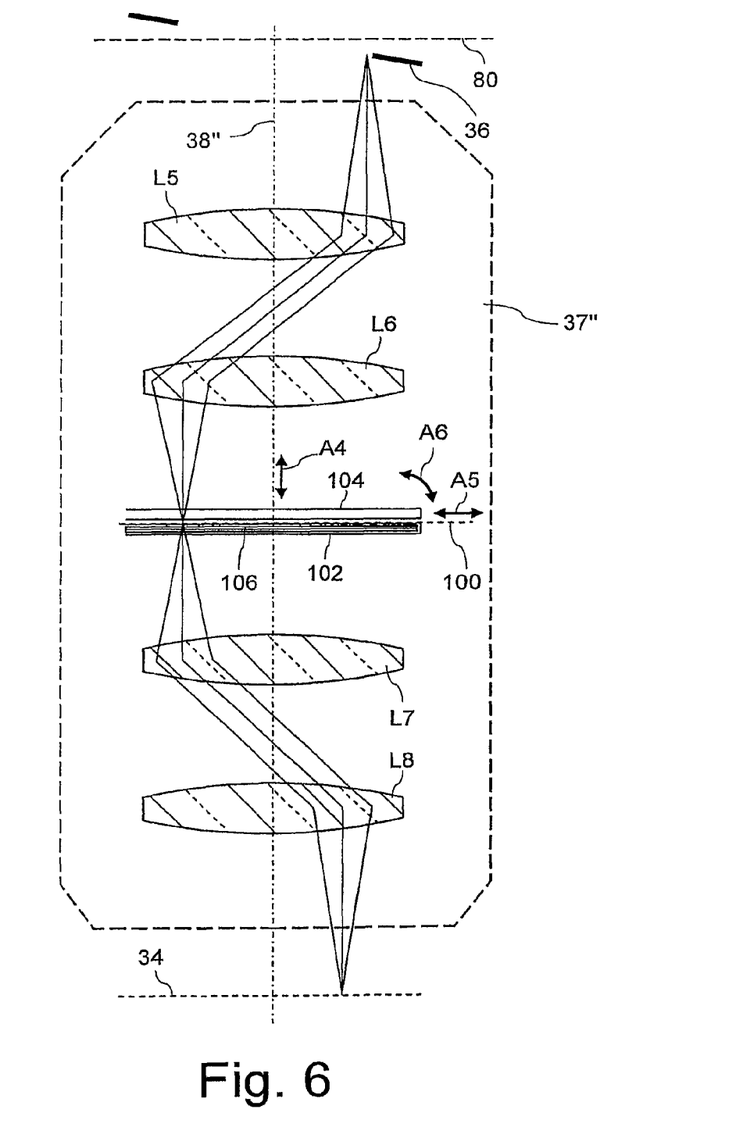
FIG. 6 is a simplified meridional section through a field stop lens of an illumination system according to a second aspect of the invention.

FIG. 6 shows a meridional section through a field stop lens 37'' that can be advantageously used in the embodiment shown in FIGS. 3 to 5 and also in other conventional illumination systems having an optical axis that is coaxial to the optical axis of the projection lens.

The field stop lens 37'' comprises four lens elements L5, L6, L7 and L8 that are positioned along an optical axis 38''. The lens elements L5 to L8 are designed such that an intermediate image plane 100 is produced between the lens elements L6 and L7. In close proximity to the intermediate image plane 100, a first and a second holder 102 and 104, respectively, are positioned that are adapted to receive optical correction elements. In the illustration of FIG. 6, such a correction element is received in the holder 102 and denoted by 106. The correction element 106 comprises a layered structure and has a transmission that is dependent on the angle of incidence of the impinging light rays. This allows to modify the angular intensity distribution of the projection light produced by the illumination system 12.

The second holder 104 is adjustable so that an optical correction element received therein can be displaced in directions along and perpendicular to the optical axis 38'', as is indicated by arrows A4 and A5, respectively. In addition, the holder can be tilted, as is indicated in FIG. 6 by a further arrow A6.

In principle, the holders 102, 104 may receive all optical elements that have to be positioned in or in close proximity to a field plane of an illumination system. For example, diffractive or refractive optical elements will modify the angular distribution of the projection light bundles impinging on field points on the illuminated field 14. A gray filter may be positioned in or in close proximity to the additional intermediate image plane 100 that corrects or eliminates residual non-uniformities of the intensity distribution. Disturbances of the desired polarization distribution across the illuminated field 14 may be corrected by a polarization manipulating optical element, for example a polarizer or a rotator that rotates the polarization direction of incident linearly polarized light. The polarization manipulating properties of such elements may vary over the area of the intermediate image plane 100.

By dislocating or tilting the holder 104, the effect of an optical correction element received in this holder 104 may be adjusted as desired. Such adjustments may be particularly useful in the case of refractive or diffractive optical elements. Apart from that, the holders 102, 104 may be configured such that an optical correction element is fixedly received therein, or they may be realized as exchange holders that allow to receive different optical correction elements.

A correction element in the intermediate field plane 100 may also be used for further improving the match between the principle ray distributions of the illumination system 12 and the projection lens 24. Since the intermediate field plane 100 is conjugate to the mask plane 34, it is a particularly well suited location for modifications of the principle ray distribution of the illumination system.

The invention claimed is:

1. A system, comprising:
   a field stop and
   a field stop lens comprising:
   a first lens that images the field stop onto an intermediate image plane; and
   a second lens that images the intermediate image plane onto an image plane,
   wherein the system is a microlithographic exposure apparatus illumination system that is configured to illuminate a mask positioned on a mask plane.

2. The system of claim 1, further comprising a correction element positioned in or in close proximity to the intermediate image plane.

3. The system of claim 2, wherein the correction element is positioned within 100 mm off the intermediate image plane.

4. The system of claim 3, wherein the correction element is positioned within 30 mm off the intermediate image plane.

5. The system of claim 2, wherein the correction element is a grey filter.

6. The system of claim 2, wherein the correction element is a refractive or a diffractive optical element.

7. The system of claim 2, wherein the correction element is a stop.

8. The system of claim 1, wherein the correction element comprises static or individually movable semi-transparent or opaque fingers for intensity distribution control.

9. The system of claim 1, wherein the correction element is a lens group.

10. The system of claim 9, wherein the lens group includes at least one aspherical lens element.

11. The system of claim 1, wherein the correction element is a polarization manipulating optical element.

12. The system of claim 11, wherein the polarization manipulating optical element is a polarizer.

13. The system of claim 12, wherein the polarization manipulating optical element is a rotator that rotates the polarization direction of incident linearly polarized light.

14. The system of claim 1, wherein the correction element comprises a layered structure having a transmission that is dependent on the angle of incidence of an impinging light ray.

15. The system of claim 1, wherein the correction element is received in a holder configured to allow adjustment of the position of the correction element.

16. The system of claim 15, wherein the holder is configured to allow displacement of the correction element along an optical axis of the illumination system.

17. The system of claim 15, wherein the holder is configured to allow displacement of the correction element along a direction that is inclined to an optical axis of the illumination system.

18. The system of claim 15, wherein the holder is configured to allow the correction element to tilt.

19. The system of claim 15, wherein the holder is configured to allow the correction element to deform.

20. The system of claim 15, wherein the holder is an exchange holder configured to receive different correction elements.

21. A system, comprising:
   the microlithographic exposure apparatus illumination system according to claim 1, wherein the system is a microlithographic exposure apparatus.

22. A method, comprising:
   a) providing a substrate supporting a light sensitive layer;
   b) providing a mask containing structures to be imaged onto the light sensitive layer;
   c) providing a system according to claim 1;
   d) projecting at least a part of the mask onto the light sensitive layer.

23. A method according to claim 22, wherein the method makes a micro structured device.

* * * * *

UNITED STATES PATENT AND TRADEMARK OFFICE
CERTIFICATE OF CORRECTION

PATENT NO. : 9,046,787 B2
APPLICATION NO. : 13/007039
DATED : June 2, 2015
INVENTOR(S) : Toralf Gruner, Alexander Epple and Markus Deguenther It is certified that error appears in the above-identified patent and that said Letters Patent is hereby corrected as shown below:

Specification
Col. 5, line 26, delete "N1," and insert -- M1, --.
Claims
Col. 9, line 35, Claim 8, delete "1," and insert -- 2, --.
Col. 9, line 38, Claim 9, delete "1," and insert -- 2, --.
Col. 10, line 1, Claim 11, delete "1," and insert -- 2, --.
Col. 10, line 8, Claim 14, delete "1," and insert -- 2, --.
Col. 10, line 11, Claim 15, delete "1," and insert -- 2, --.

Signed and Sealed this
First Day of December, 2015

Michelle K. Lee
*Director of the United States Patent and Trademark Office*